(12) United States Patent
Guarisco et al.

(10) Patent No.: US 10,186,308 B1
(45) Date of Patent: Jan. 22, 2019

(54) MAGNETIC RANDOM ACCESS MEMORY HAVING IMPROVED RELIABILITY THROUGH THERMAL CLADDING

(71) Applicant: Spin Transfer Technologies, Inc., Fremont, CA (US)

(72) Inventors: Davide Guarisco, San Jose, CA (US); Eric Michael Ryan, Fremont, CA (US); Marcin Gajek, Berkeley, CA (US); Girish Jagtiani, Santa Clara, CA (US)

(73) Assignee: Spin Transfer Technologies, Inc., Fremont, CA (US)

( * ) Notice: Subject to any disclaimer, the term of this patent is extended or adjusted under 35 U.S.C. 154(b) by 0 days.

(21) Appl. No.: 15/862,495

(22) Filed: Jan. 4, 2018

(51) Int. Cl.
| | | |
|---|---|---|
| *G11C 11/00* | (2006.01) | |
| *G11C 11/16* | (2006.01) | |
| *H01L 43/10* | (2006.01) | |
| *H01L 27/22* | (2006.01) | |
| *H01L 43/12* | (2006.01) | |
| *G11C 11/15* | (2006.01) | |

(52) U.S. Cl.
CPC ............ *G11C 11/161* (2013.01); *G11C 11/15* (2013.01); *G11C 11/1659* (2013.01); *G11C 11/1673* (2013.01); *G11C 11/1675* (2013.01); *H01L 27/222* (2013.01); *H01L 43/10* (2013.01); *H01L 43/12* (2013.01)

(58) Field of Classification Search
CPC ..... G11C 11/161; G11C 11/15; G11C 11/1659; G11C 11/1673; G11C 11/1675
See application file for complete search history.

(56) References Cited

U.S. PATENT DOCUMENTS

| | | | |
|---|---|---|---|
| 2014/0261604 A1* | 9/2014 | Jha | H01L 35/22 136/200 |
| 2017/0243919 A1* | 8/2017 | Seong | H01L 27/2427 |

* cited by examiner

*Primary Examiner* — Mohammed A Bashar
(74) *Attorney, Agent, or Firm* — Zilka-Kotab, P.C.

(57) ABSTRACT

A Magnetic Random Access Memory (MRAM) structure having a thermally conductive, dielectric cladding material that contacts an outer side of a magnetic memory element. The magnetic memory element can be a magnetic tunnel junction element formed as a cylindrical pillar that extends between first and second electrically conductive lead layers. The cylinder of the magnetic memory element can have an outer periphery, and the cladding material can be formed to contact the entire periphery. In addition, a heat sink structure formed of a dielectric material having a high specific heat capacity can be formed to contact an outer periphery of the cladding material. The cladding material and heat sink structure efficiently conduct heat away from the sides of the memory element to prevent the temperature of the memory element to rise to unsafe levels. This advantageously assists in maintaining a high reliability and long life of the MRAM system.

20 Claims, 6 Drawing Sheets

| Material | Thermal conductivity (W/m/K) | Specific heat capacity (J/kg/K) | Dielectric constant |
|---|---|---|---|
| $SiO_2$ (bulk, amorphous) | 1.4 | 700 | 3.8 |
| $SiO_2$ (ion-beam sputtered) | 1.1 | | |
| $Si_3N_4$ (amorphous) | 30 | 170 | 7 |
| AlN | 140-180 | 740 | 9 |
| $Al_2O_3$ | 18 | 880 | 9.1 |
| Diamond (natural, cubic) | 2200-2500 | 502 | 5-6 |
| DLC-C | 1000 | | 4-11 |
| CVD-C (cubic) | 1100 | 750 | 5.7 |

Table 1. Thermal conductivity of various dielectrics at room temperature.

FIG. 6

MAGNETIC RANDOM ACCESS MEMORY HAVING IMPROVED RELIABILITY THROUGH THERMAL CLADDING

FIELD OF THE INVENTION

The present invention relates to magnetic random access memory (MRAM) and more particularly to a memory element having a thermal cladding structure for dissipating heat.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic insulating layer such as a tunnel barrier layer, which can be constructed of a material such as MgO. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest level (low resistance state). Conversely, when the magnetization of the magnetic free layer is in a direction that is opposite to that of the magnetic reference layer, the electrical resistance across the MTJ element is at its highest level (high resistance state).

The switching of the MTJ element between high and low resistance states results from electron spin torque transfer. Generally, electrons flowing through a conductive material have random spin orientations with no net spin polarization. However, when electrons flow through a magnetized layer, the spin orientations of the electrons become aligned so that there is a net polarization of the current, and the orientation of this alignment is dependent on the orientation of the magnetization of the magnetic layer through which they travel. When the magnetizations of the free and reference layer are oriented in the same direction, the spin of the electrons in the free layer are in generally the same direction as the orientation of the spin of the electrons in the reference layer. Because these electron spins are in generally the same direction, the electrons can pass relatively easily through the tunnel barrier layer. However, if the orientations of the magnetizations of the free and reference layers are opposite to one another, the spin of the electrons in the free layer will be generally opposite to the spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an off or "0", whereas the high resistance state can be read as a "1". In addition, because the magnetic orientation of the free layer remains stable without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded data bit is non-volatile in that it remains intact in the absence of any electrical power. The amount of current needed to switch the MTJ element is significantly larger than the amount needed to read it. During the write operation, the current flowing through the pillar causes significant self-heating in the proximity of the tunneling barrier.

SUMMARY

The present invention provides a Magnetic Random Access Memory Apparatus that includes magnetic memory element pillar having first and second ends and an outer side extending between the two ends. First and second electrically conductive leads are arranged such that the magnetic memory element pillar is located between the first and second electrically conductive leads and such that each of ends of the magnetic memory element pillar are electrically connected with the first and second electrically conductive leads. Cladding material is provided to contact the outer side of the magnetic memory element. The cladding material is a material that has both a high thermal conductivity and a high dielectric constant.

The cladding material advantageously conducts heat away from the memory element to prevent the memory element from heating to an unsafe temperature during operation. This prevents damage to the memory element, thereby improving reliability of and extending the life of the MRAM system.

The cladding material can be constructed of a material having a thermal conductivity of at least 500 W/m/K, and having dielectric constant of at least 4. For example, the cladding material can be constructed of carbon, such as cubic carbon, diamond-like carbon coating or carbon deposited by chemical vapor deposition.

The memory element, which can be a tunnel junction element, can be formed as a cylindrical pillar having an outer periphery, and the cladding material can be formed so as to contact and surround the entire periphery of the memory element.

In addition to the cladding material, a heat sink structure can be included. The heat sink structure can be a dielectric material having a high specific heat capacity. For example, the heat sink structure can have a specific heat capacity of at least 500 J/kg/K, and a dielectric constant of at least 4. The heat sink structure can be formed so as to surround and contact an entire periphery of the cladding material and to extend between the first and second leads.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

FIG. 6 is a table of thermal properties and dielectric constants for various dielectric materials.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
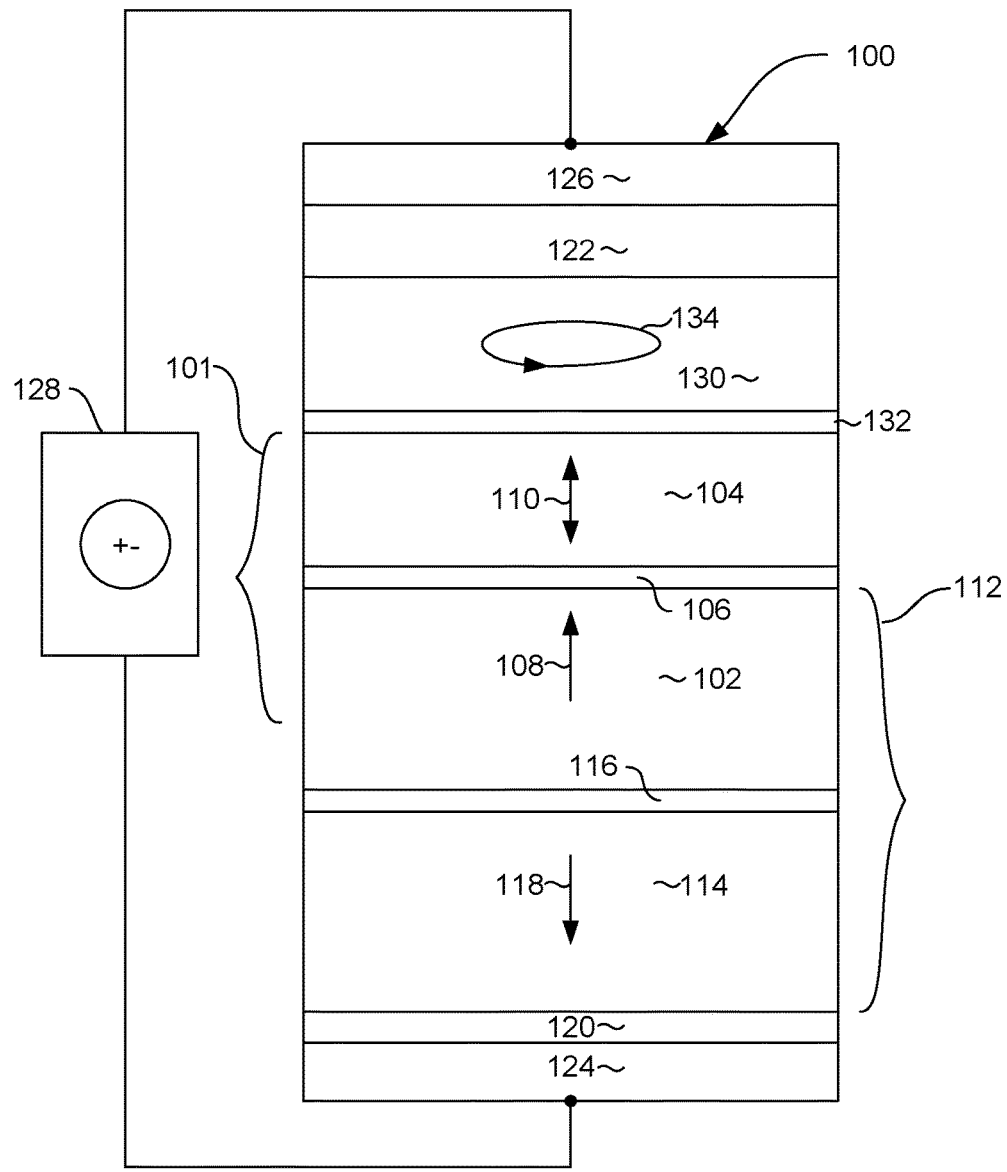
FIG. 1 is a schematic, cross sectional view of a perpendicular magnetic tunnel junction (pMTJ) element, such as might be used in an embodiment of the invention.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating non-magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer 104 has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 has a low value (low resistance state). Conversely, when the magnetization 110 of the free layer 104 is opposite to the magnetization 108 of the reference layer 102, the electrical resistance across the layers 102, 106, 104 has a high value (high resistance state).

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it antiferromagnetically couples the layers 114, 102. The antiparallel coupling between the layers 114, 102 pins the magnetization 108 of the reference layer 102 in a direction that is opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing. Also, electrodes 124, 126 may be provided at the top and bottom of the memory element 100. The electrodes 124, 126 may be constructed of a non-magnetic, electrically conductive material such as Au and can provide electrical connection with circuitry 128 that can include a current source and can further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in an upward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in a downward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons will not be able to pass through the barrier layer 106. As a result, the electrons (which have been spin polarized by the magnetization 110 of the free layer 104), will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 may include a spin polarization layer 130 formed above the free layer 104. The spin polarization layer can be separated from the free layer 104 by an exchange coupling layer 132. The spin polarization layer 130 has a magnetic anisotropy that causes it to have a magnetization 134 with a primary component oriented in the in-plane direction (e.g. perpendicular to the magnetizations 110, 108 of the free and reference layers 104, 102). The magnetization 134, of the spin polarization layer 130 may either be fixed or can move in a precessional manner as shown in FIG. 1. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

Figure 2:
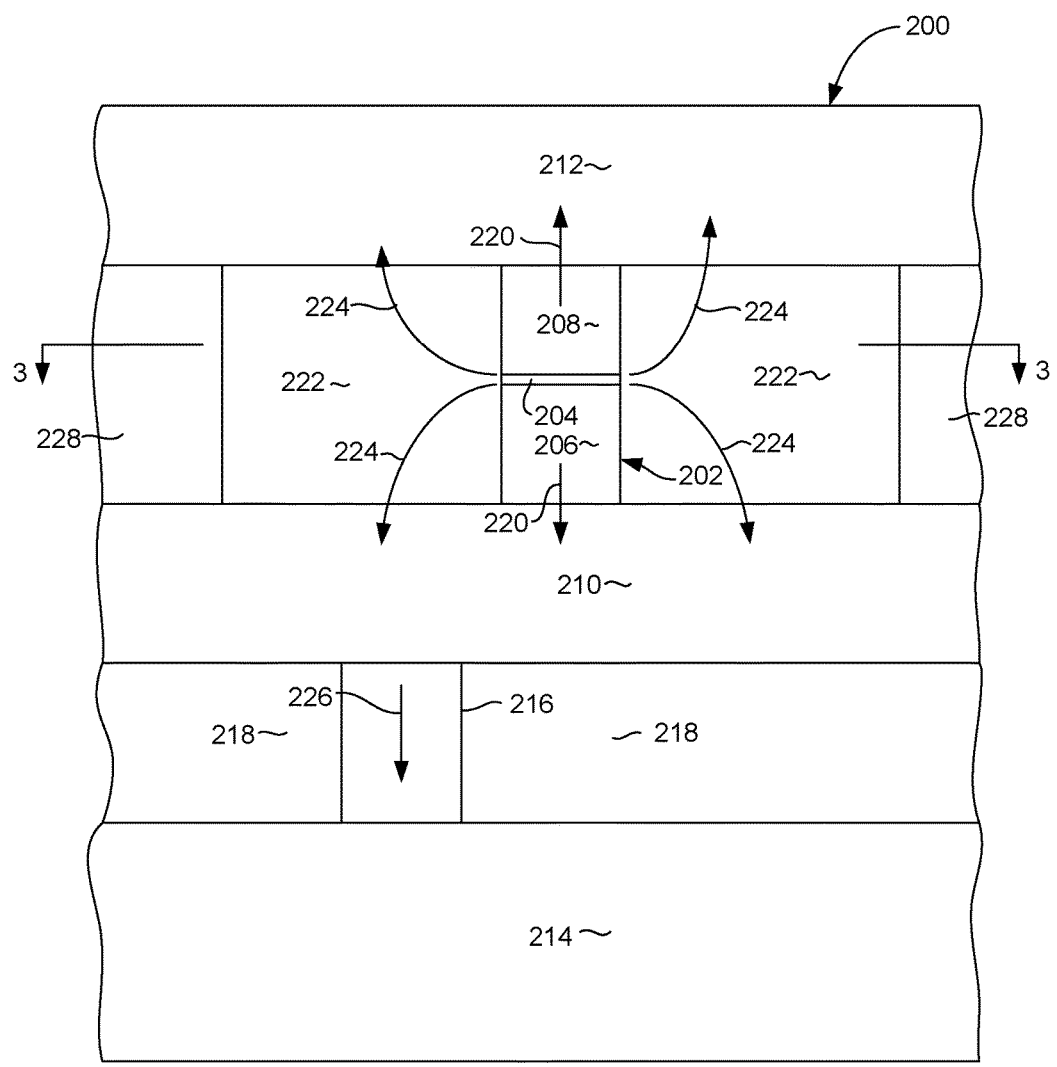
FIG. 2 is a side, cross-sectional view of a magnetic random access memory structure according to an embodiment.

FIG. 2 shows a side cross-sectional view of a magnetic random access memory structure 200 that includes a magnetic memory element pillar 202. The magnetic memory element pillar 202 can have a structure such as the memory element 100 described above with reference to FIG. 1. However, that is by way of example, and the memory element pillar 202 can have some other suitable structure. The memory element 202 can include a thin non-magnetic barrier layer 204 formed of a material such as MgO. The barrier layer 204 can be sandwiched between a magnetic reference layer 206 and a magnetic free layer 208. The magnetic reference layer 206 has a magnetization that is fixed, preferably in a direction that is perpendicular to the plane of the layer, and the magnetic free layer 208 has a magnetization that is free to move between two states, such as described above with reference to FIG. 1. The magnetic memory element pillar 202 can include other structures as well, however, these have been omitted for purposes of clarity.

The magnetic memory element 202 is located between upper and lower electrically conductive layers 210, 212 that function to provide electrical current through the memory element 202 and to read a magnetic bit from the magnetic memory element 202 by reading the electrical resistance state of the memory element 202. The electrical lead layers 210, 212 can be constructed as electrically conductive metallic plates and are sometime referred to as a word line and a bit line. One of the electrically conductive lead layers 210 can be electrically connected with circuitry such as CMOS circuitry 214 for operating the memory element 202. The connection between the lead 210 and CMOS circuitry 214 can be achieved by an electrically conductive via 216, which also can be constructed of an electrically conductive metal and which can extend through an electrical insulation layer 218, such as alumina or silicon dioxide.

In order to prevent electrical shunting and to ensure that the current between the leads 210, 212 travels through the memory element 202 as desired, the areas that laterally surround the memory element 202 are preferably constructed of a dielectric, electrically insulating material. Operation of the memory element 202 generates a significant amount of heat. This heat is generated when a current flows through the memory element in order to switch the magnetic state of the memory element 202, and this heating is primarily generated at the location of the magnetic barrier layer 204, where the electrical resistance through the memory element is highest. This generated heat can raise the temperature of the memory element 202 significantly, which can result in failure and loss of reliability of the system.

Some of this heat can be dissipated away from the memory element 202 through upper and lower contact between the memory element 202 and upper and lower leads 210, 212, as indicated by arrows 220. However, as can be appreciated, the area of contact between the memory element 202 and the upper and lower leads 210, 212 is very limited, which severely limits the amount of heat that can conduct from the memory element 202 to the leads 210, 212. This is especially true as the size of such memory elements 202 becomes ever smaller in an effort to increase data density.

As mentioned above, the areas to the sides of the memory element need to be constructed of a dielectric material in order to prevent current shunting. Typical materials for use as a dielectric fill material include materials such as silicon dioxide ($SiO_2$). However, such materials provide poor thermal conductivity for dissipating heat away from the memory element 202. For example, ion beam sputtered $SiO_2$ has a thermal conductivity of only 1.1 W/m/K and bulk amorphous $SiO_2$ has a thermal conductivity of 1.4 W/m/K.

The present invention overcomes this problem by providing a thermally conductive cladding material 222 at the sides of the memory element 202. The thermal cladding material is constructed of a material that is both thermally conductive and dielectric. Preferably, the thermal cladding material 222 has a thermal conductivity of at least 500 W/m/K and a dielectric constant of at least 4, to ensure sufficient heat dissipation while also preventing current shunting at the side of the memory element.

To this end, the thermally conductive cladding material 222 can be constructed of a material such as carbon. Various carbon structures are available, which provide good thermal conductivity as well as having a sufficiently high dielectric constant to prevent current shunting. The table of FIG. 6 shows the thermal properties and dielectric constants of various dielectric materials. In FIG. 6 it can be seen that carbon has both good thermal conductivity and dielectric properties. Natural cubic diamond has by far the best thermal properties, having a thermal conductivity of 2200-2500 W/m/K, while also having a dielectric constant of 5-6. Diamond Like Carbon (DLC) has also has good thermal conductivity of 1000 W/m/K. Similarly, carbon deposited by Chemical Vapor Deposition (CVD) having a cubic crystalline structure has a thermal conductivity of 1100 W/m/K. These thermal conductivity values are much higher than the thermal conductivity of $SiO_2$, which is only 1.1 or 1.4 W/m/K, or alumina ($Al_2O_3$) which is only 18 W/m/K.

As represented by arrows 224 in FIG. 2, the thermally conductive cladding material 222 conducts heat away from the sides of the memory element pillar structure 202 to adjacent portions of the metal plates 210, 212, where the heat can be dissipated to surrounding structure. The presence of the via 216 can further help to conduct heat to the CMOS structure 214 and underlying wafer material as indicated by arrow 226. Areas laterally outside of the thermal cladding structure 222 can be filled with a more standard dielectric fill material 228, such as $SiO_2$.

Figure 3:
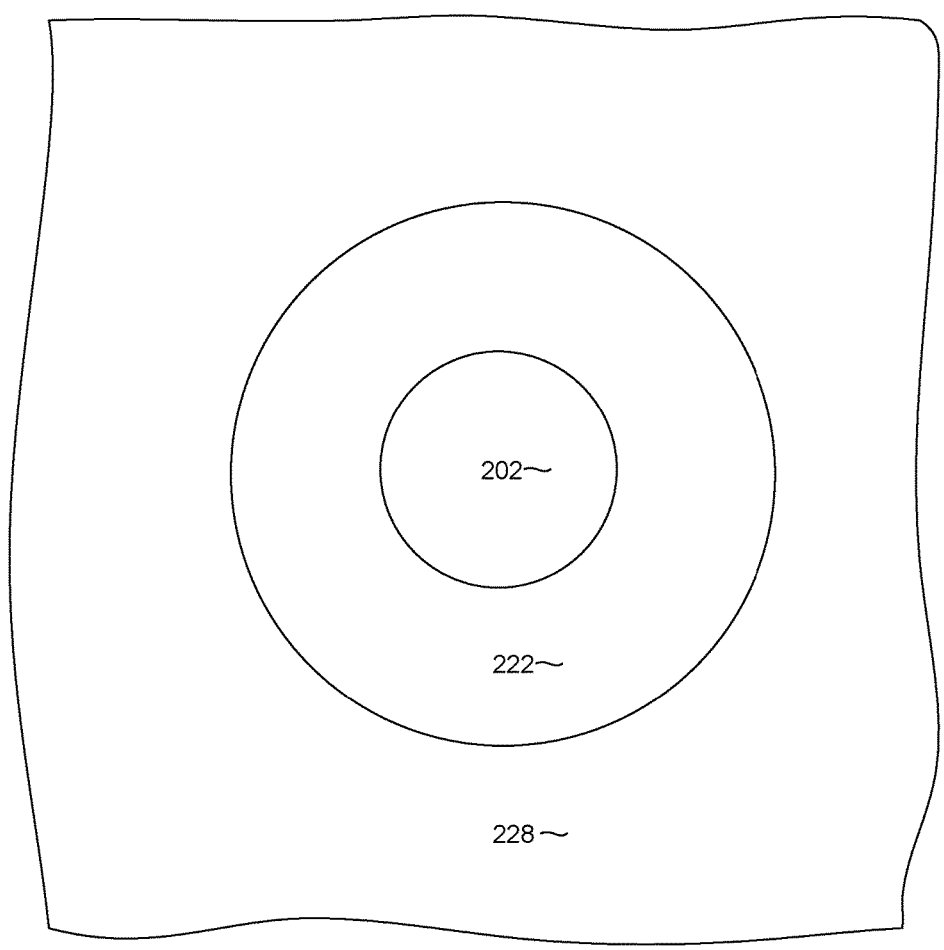
FIG. 3 is a top-down, cross-sectional view as seen from line 3-3 of FIG. 2.

FIG. 3 shows a top down, cross-sectional view as seen from line 3-3 of FIG. 2. As seen in FIG. 3, the magnetic element pillar 202 can be formed as a cylindrical pillar having a substantially round cross section as viewed in FIG. 3. Advantageously, the cladding 222 completely surrounds the magnetic element pillar 202, making contact with the entire periphery of the magnetic element pillar 202. This provides an advantageously large area of contact between the thermal cladding material 222 and the magnetic element pillar 202, thereby maximizing the heat conduction away from the magnetic memory element pillar.

With reference again to FIG. 2, it can be seen that the thermally conductive cladding material 222 also advantageously maximizes heat conduction at the location of the barrier layer (i.e. at the vertical center of the pillar 202), where the heat conduction is needed most. As will be recalled, the majority of the heat generated in the magnetic memory element pillar 202 is generated at the location of the magnetic barrier layer 204. Direct contact between the memory element pillar 202 and the metal plates 210, 212 is at the top and bottom of the memory element pillar 202 at the furthest point away from the barrier layer 204, where the heat is generated. Therefore, without the thermally conductive cladding material 222, the generated heat would have to be conducted through all of the other structures of the memory element pillar 202 before being conducted to the metal plates 210, 212. What's more, this thermal conduction would have to occur through the very narrow structure of the memory element pillar 202 and through the small area of direct contact between the memory element 202 and metal plates 210, 212, further limiting heat dissipation and heating the structures 204, 206, 208 to the point of failure. The thermal cladding material 222, however, advantageously conducts heat directly from the area of the barrier layer 204 where it is needed most and also maximizes the area of contact for heat dissipation from the magnetic memory element pillar.

Figure 4:
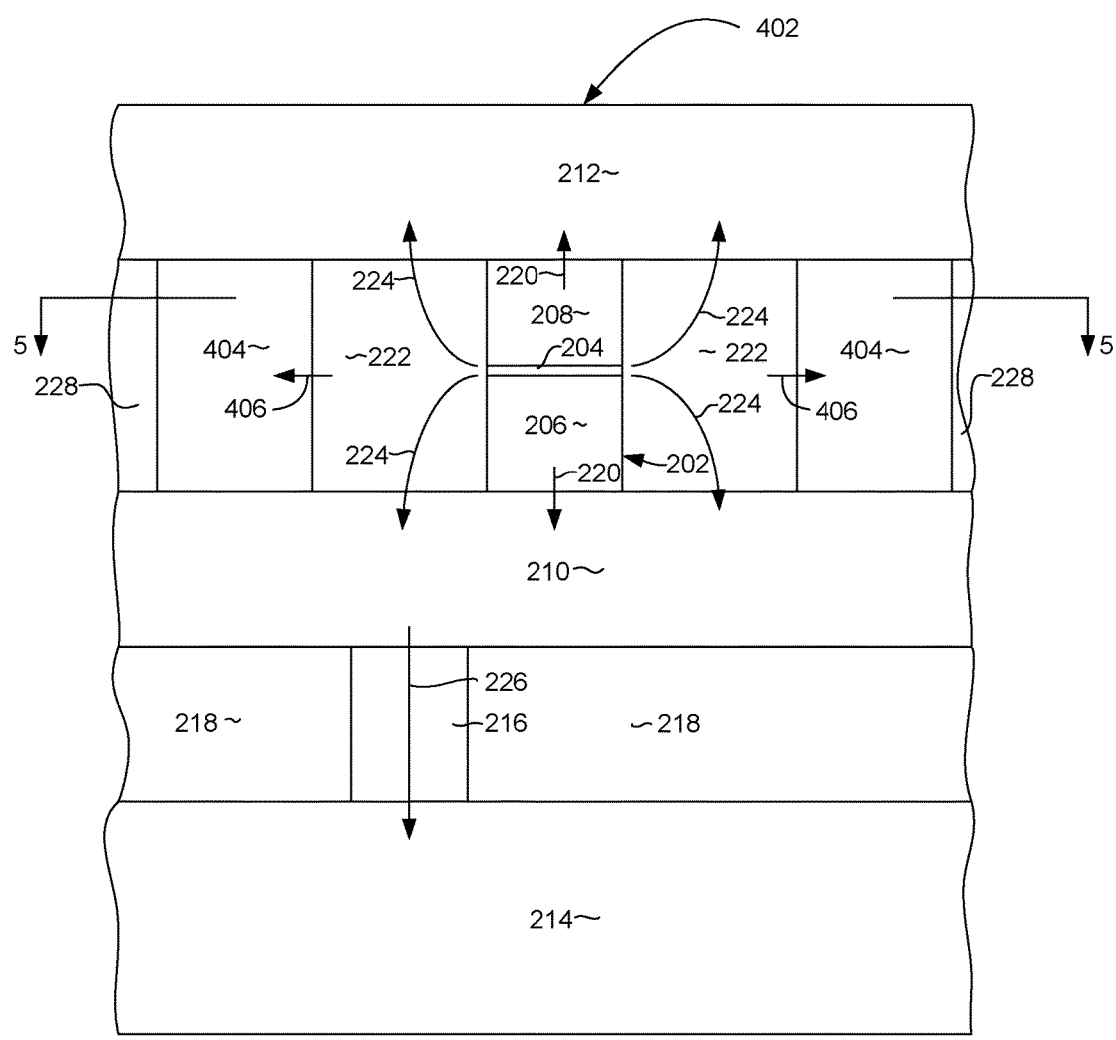
FIG. 4 is a side, cross-sectional view of a magnetic random access memory structure according to an alternate embodiment.
Figure 5:
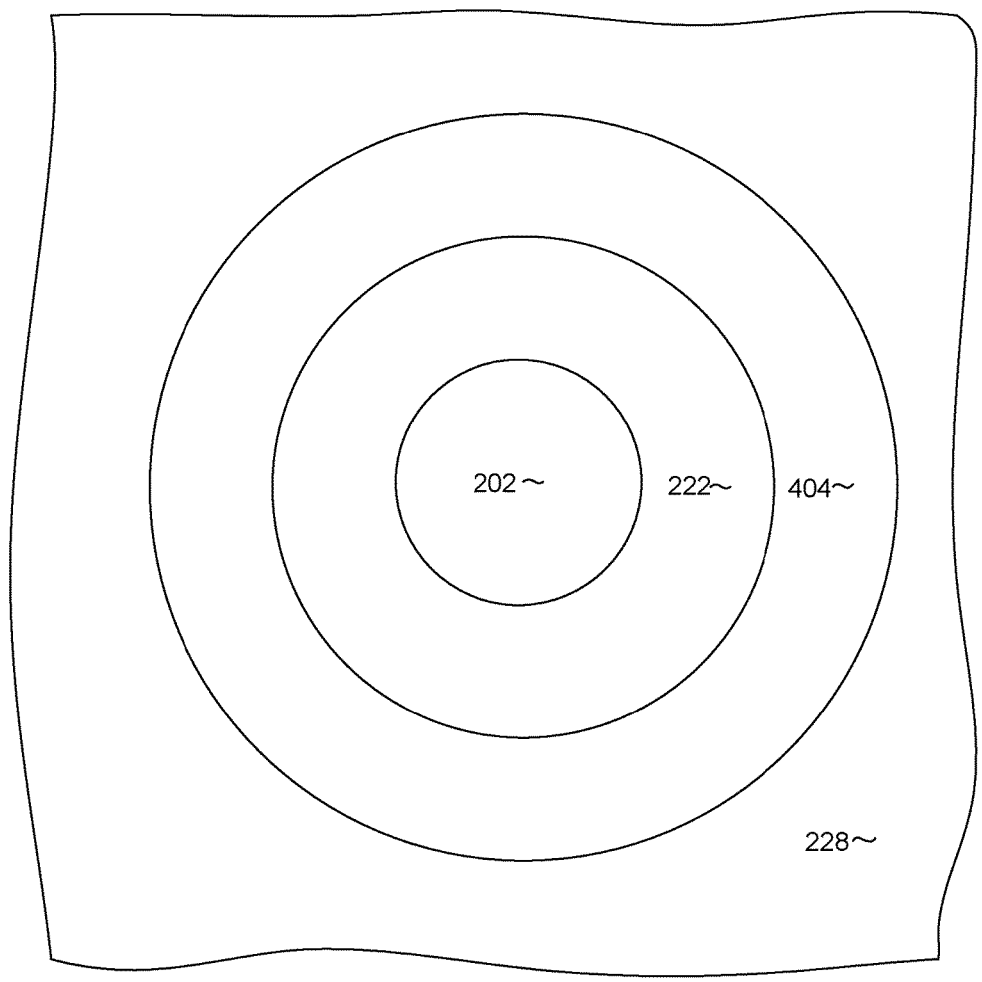
FIG. 5 is a top-down, cross-sectional view as seen from line 5-5 of FIG. 4.

FIGS. 4 and 5, illustrate a magnetic memory element structure 402 according to another embodiment. FIG. 4 shows a side, cross sectional view similar to that of FIG. 2, and FIG. 5 shows a top-down, cross-sectional view as seen from line 5-5 of FIG. 4. As with the previously described embodiment, the structure 402 includes a thermally conductive cladding structure 222, that preferably completely surrounds and contacts the outer side of the magnetic memory element pillar 202. In addition, the memory structure 402 includes a thermal heat sink structure 404 that surrounds and contacts the thermally conductive cladding structure 222. The heat sink structure 404 is constructed of a material having a high thermal capacity. This allows the heat sink structure 404 to efficiently absorb heat from the thermally conductive cladding structure 222 as indicated by arrows 406, thereby further increasing the dissipation of heat from the magnetic element pillar 202. In order to provide efficient absorption of heat from the thermally conductive cladding material, the heat sink structure 404 preferably has a heat capacity of at least 500 J/kg/K, while also having a dielectric constant of at least 4 to prevent current shunting.

Referring again to the table of FIG. 6, it can be seen that alumina ($Al_2O_3$) provides a high thermal capacity of 880 J/Kg/K, while also having a dielectric constant of 9.1. Aluminum Nitride (AlN) also has a good thermal heat capacity of 800 J/Kg/K, while also providing a good dielectric constant of 9. These heat capacity values are much higher than the heat capacity values provided by the thermally conductive cladding material 222. Therefore, the heat sink material 404 can be constructed of alumina ($Al_2O_3$) or AlN to provide good properties for absorbing heat from the thermally conductive cladding material 222.

It can be seen that the above described thermally conductive cladding structure 222, surrounding the magnetic memory element 202 greatly enhances the conduction of generated heat away from the memory element 202. This structure, especially in conjunction with the surrounding heat sink structure 404 of FIGS. 4 and 5 greatly improves the reliability of the memory element 202 and greatly increases the lifespan of a magnetic memory system incorporating such as structure.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A magnetic random access memory apparatus, comprising:
    a magnetic memory element pillar having first and second ends and an outer side extending between the first and second ends;
    first and second electrically conductive leads arranged such that the magnetic memory element pillar is between the first and second electrically conductive leads and each of the ends of the magnetic memory element pillar is electrically connected with one of the first and second electrically conductive leads; and
    a cladding material contacting the outer side of the magnetic element pillar, the cladding material being constructed of a material that is both dielectric and has a high thermal conductivity.

2. The magnetic random access memory apparatus as in claim 1, wherein the cladding material has a thermal conductivity of at least 500 W/m/K.

3. The magnetic random access memory apparatus as in claim 1, wherein the cladding material has a thermal conductivity of at least 500 W/m/K and has a dielectric constant of at least 4.

4. The magnetic random access memory apparatus as in claim 1, wherein the cladding material comprises carbon.

5. The magnetic random access memory apparatus as in claim 1, wherein the cladding material comprises carbon having a cubic crystalline structure.

6. The magnetic random access memory apparatus as in claim 1, wherein the cladding material comprises carbon formed as diamond like carbon.

7. The magnetic random access memory apparatus as in claim 1, wherein the cladding material comprises carbon deposited by chemical vapor deposition.

8. The magnetic random access memory apparatus as in claim 1, wherein the cladding material contacts an entire periphery of the outer side of the magnetic memory element pillar.

9. The magnetic random access memory apparatus as in claim 8, wherein the cladding material extends from the first electrically conductive lead to the second electrically conductive lead.

10. The magnetic random access memory apparatus as in claim 1, wherein the magnetic memory element pillar has a generally cylindrical shape having an outer perimeter, and wherein the cladding material contacts an entire perimeter of the cylinder.

11. The magnetic random access memory apparatus as in claim 1, wherein the magnetic memory element pillar is a magnetic tunnel junction element having a magnetic reference layer, a magnetic free layer and a non-magnetic barrier layer located between the magnetic reference layer and the magnetic free layer.

12. A magnetic random access memory apparatus, comprising:
    a magnetic memory element pillar having first and second ends and an outer side extending between the first and second ends;
    first and second electrically conductive leads arranged such that the magnetic memory element pillar is between the first and second electrically conductive leads and each of the ends of the magnetic memory element pillar is electrically connected with one of the first and second electrically conductive leads;

a cladding material contacting the outer side of the magnetic element pillar, the cladding material being constructed of a material that is both dielectric and has a high thermal conductivity; and a heat sink material contacting the cladding material, the heat sink material being constructed of a material that is both dielectric and has a specific high heat capacity.

13. The magnetic random access memory apparatus as in claim 12, wherein the heat sink material has a specific heat capacity of at least 500 J/kg/K.

14. The magnetic random access memory apparatus as in claim 12, wherein the heat sink material has a specific heat capacity of at least 500 J/kg/K and has a dielectric constant of at least 4.

15. The magnetic random access memory apparatus as in claim 12, wherein the heat sink material comprises AN.

16. The magnetic random access memory apparatus as in claim 12, wherein the heat sink material comprises alumina.

17. The magnetic random access memory apparatus as in claim 12, wherein the heat sink material is located between the first and second electrically conductive leads and surrounds the cladding material.

18. The magnetic random access memory apparatus as in claim 12, wherein the cladding material has an outer periphery, and wherein the heat sink material contacts the entire outer periphery of the cladding material, while also contacting the first and second electrically conductive leads.

19. The magnetic random access memory apparatus as in claim 12, wherein the magnetic element pillar is formed as a cylinder having an outer periphery, and wherein the cladding material contacts the outer periphery of the cylinder.

20. The magnetic random access memory apparatus as in claim 12, wherein the magnetic memory element is a magnetic tunnel junction having a magnetic reference layer, a magnetic free layer and a non-magnetic barrier layer located between the magnetic reference layer and the magnetic free layer.

\* \* \* \* \*

UNITED STATES PATENT AND TRADEMARK OFFICE
CERTIFICATE OF CORRECTION

| | |
|---|---|
| PATENT NO. | : 10,186,308 B1 |
| APPLICATION NO. | : 15/862495 |
| DATED | : January 22, 2019 |
| INVENTOR(S) | : Davide Guarisco et al. |

It is certified that error appears in the above-identified patent and that said Letters Patent is hereby corrected as shown below:

In the Claims

Column 9, Line 16 Claim 15 please replace "comprises AN." with --comprises AlN.--.

Signed and Sealed this
Eighteenth Day of February, 2020

Andrei Iancu
*Director of the United States Patent and Trademark Office*